(12) United States Patent
Liu et al.

(10) Patent No.: US 7,756,492 B2
(45) Date of Patent: Jul. 13, 2010

(54) PREDISTORTION DEVICE BASED ON VECTOR ENVELOPE INJECTION AND THE METHOD THEREOF

(75) Inventors: Xiaowei Liu, Guangdong (CN); Hongtao Ru, Guangdong (CN)

(73) Assignee: ZTE Corporation, Guangdong (CN)

( * ) Notice: Subject to any disclaimer, the term of this patent is extended or adjusted under 35 U.S.C. 154(b) by 525 days.

(21) Appl. No.: 11/814,636

(22) PCT Filed: Jan. 25, 2005

(86) PCT No.: PCT/CN2005/000108

§ 371 (c)(1),
(2), (4) Date: Jul. 24, 2007

(87) PCT Pub. No.: WO2006/079241

PCT Pub. Date: Aug. 3, 2006

(65) Prior Publication Data

US 2008/0164943 A1    Jul. 10, 2008

(51) Int. Cl.
H04B 1/04        (2006.01)
(52) U.S. Cl. ............... 455/114.3; 455/63.1; 455/550.1; 375/296; 330/149
(58) Field of Classification Search ............. 455/63.1, 455/114.3, 550.1; 375/296; 330/149
See application file for complete search history.

(56) References Cited

U.S. PATENT DOCUMENTS 5,949,283 A * 9/1999 Proctor et al. ............... 330/149
6,029,285 A * 2/2000 Belcher et al. ............... 330/149
6,104,241 A   8/2000 Cova et al.
6,438,360 B1 * 8/2002 Alberth et al. ............... 455/110
6,766,151 B2 * 7/2004 Kusunoki ................. 455/114.3
2008/0106333 A1 * 5/2008 Liu ........................... 330/149

FOREIGN PATENT DOCUMENTS

| CN | 1384602 A | 12/2002 |
|---|---|---|
| CN | 1390022 A | 1/2003 |
| CN | 1462153 A | 12/2003 |
| CN | 1516493 A | 7/2004 |

* cited by examiner

Primary Examiner—Nhan Le
(74) Attorney, Agent, or Firm—Sughrue Mion, PLLC

(57) ABSTRACT

The present invention discloses a predistortion method based on vector envelope injection. The method includes the following steps: radio frequency input signals are divided into two signal streams; one input signal stream generates two envelope injection signals whose amplitudes can be adjusted independently; the other signal stream is divided into further two radio frequency signal streams; the two radio frequency signal streams are amplified with the same amplitude; frequency mixing is performed for the two envelope injection signals and two radio frequency signal streams respectively to obtain two compensation signals; the amplified radio frequency signal and compensation signals are power synthesized in the same way, so as to obtain two compensation signals and amplified radio frequency signals of different directions. This present invention also provides a corresponding predistortion device.

5 Claims, 5 Drawing Sheets

PREDISTORTION DEVICE BASED ON VECTOR ENVELOPE INJECTION AND THE METHOD THEREOF

TECHNICAL FIELD

The present invention relates to a linearized technique of radio frequency power amplifier in radio transmitters, and more particularly to a method and a device which improve linearity of radio frequency power amplifier by using an envelope injection technique.

TECHNICAL BACKGROUND

In recent years, with the rapid development of wireless communication throughout the world, radio frequency spectrum resources are becoming increasingly inadequate. In order to make more effective use of the limited frequency spectrum resources, many wireless communication systems employ methods of linear modulation, by which the utilization ratio of frequency spectrum is higher. Because both the phase and the amplitude of a linear modulated signal carry useful information, any nonlinear amplification for this signal may cause an increase in bit error rate and an interference for adjacent radio frequency channel, and therefore it is necessary to ensure the linearity of amplification for the linear modulated signal.

The predistortion method is a common linearized method. Compared with traditional feedforward techniques, it can have higher power efficiency and does not need sophisticated manual modulation at the same time thereby suiting a large-scale production. With the rapid development of digital signal processing techniques, digital predistortion techniques are also improved gradually. The digital predistortion techniques can be mainly divided into two kinds: one is adding predistortion compensation signal on a digital baseband, the other is controlling vector (phase, amplitude) modulation devices by using digital baseband signal to generate appropriate distortion compensation component.

Substantially, there is no essential distinction between the technique for compensation (predistortion) before distortion of an amplifier and the technique for compensation (feedforward) after distortion of the amplifier, and their results are supposed to be similar. However, memory effects exist in the amplifier, therefore the linearized result of predistortion is greatly reduced. In time domain, when there are memory effects, the distortion characteristic of the amplifier has relations with not only current input values but also previous input values; in frequency domain, memory effects imply that the amplitude of nonlinear distortion component of the amplifier will vary with modulation frequency of input signals. The existence of memory effects affects greatly the result of distortion prediction of the predistortion method, but this is not a problem for the feedforward technique in which the compensation is made after the amplifier is distorted. Therefore actually, the linearized bandwidth and linearized performance achieved by the feedforward technique are generally better than that achieved by the predistortion technique.

Another problem facing the predistortion technique is how to achieve satisfying predistortion performance within a limited space and limited resources (e.g., power, computing capacity, etc.) of mobile communication devices (e.g., mobile terminals). It is difficult for current analog predistortion to achieve the performance and stability required by applications, and common digital predistortion methods may overconsume resources.

The envelope injection technique is a linearized method with a simple implementation and reliable performance, and it uses a low frequency signal to perform distortion compensation functions. Specifically, according to this technique, the low frequency signal that is directly proportional to power envelope of input signals is injected into the amplifier and frequency mixing is performed for said envelope signal and an input original radio frequency signal using effects of second-order (even order) nonlinear frequency mixing of the amplifier itself, thereby generating a compensation signal which has the same amplitude and the opposite direction of an inter-modulated distortion signal of the amplifier itself. When taking appropriate means, the envelope injection signals may also compensate memory effects of the amplifier. In a desired case, the envelope injection may achieve almost complete distortion compensation, but in actual systems, some non-desired factors limit results of compensation, for example, phase distortion component generated by nonlinearity of input capacitance of the amplifier will increase as input power increases, which will cause the angle between compensation component and distortion component to become bigger and bigger. For this reason, the envelope injection can only achieve partial counteract of inter-modulated distortion. In order to solve the problem, the most important is to achieve "phase adjustment" of envelope injection compensation signal.

K-K M. Cheng and others from the Chinese university of Hong Kong have introduced multipoint envelope injection technique to solve the problem. This technique is simultaneously injecting two envelope signals at different positions in a cascade amplifier to obtain two degrees of freedom of control to compensate distortion signals having independent amplitude and phase. However, the phase difference between the distortion compensation components introduced by adopting this technique is usually small, therefore, it is possible for certain distortion components at specific angle to compensate ineffectively. Changing the positions of injection for envelope signals is only a method solving the problem temporally not fundamentally. Thus, the key to the problem is how to superpose two independent envelope injection signals to generate compensation signals.

SUMMARY OF THE INVENTION

The present invention aims at the technical problem described above in prior art so as to provide a predistortion method and device based on vector envelope injection to achieve the compensation component in arbitrary angle.

In accordance with an aspect of the present invention, a predistortion method based on vector envelope injection comprises the following steps of:

dividing radio frequency input signals into two signal streams;

generating two envelope injection signals in which their amplitudes can be adjusted independently by one input signal stream;

dividing the other signal stream into further two radio frequency signal streams;

amplifying said two radio frequency signal streams in which the amplifying rate is the same;

performing frequency mixing for said two envelope injection signals and said two radio frequency signal streams respectively to obtain two compensation signals;

power synthesizing for the amplified radio frequency signals and the compensation signals in the same way so as to obtain two compensation signals and amplified radio frequency signals of different directions.

Preferentially, said step of generating the two envelope injection signals further includes:

extracting the envelope signals of input signals as a quadratic item;

filtering the envelope signals to obtain their low frequency components;

adjusting the amplitudes of the low frequency envelope signals to obtain two low frequency envelope injection signals controlling respectively the amplitudes and phases of the compensation signals.

Preferentially, said step of power synthesizing for the compensation signals includes orthogonal power synthesizing for said compensation signals to obtain two orthogonal compensation signals.

In accordance with another aspect of the present invention, a predistortion device based on vector envelope injection comprises:

A multiplier for squaring radio frequency input signals;

A low pass filter for extracting low frequency components of the signals;

A first proportional unit and a second proportional unit for adjusting signal amplitude and generating two low frequency envelope injection signal streams;

A power divider for dividing the radio frequency input signals into two signal streams;

A first radio frequency amplifier for amplifying one input signal stream and performing frequency mixing for the amplified signal and one low frequency envelope injection signal stream;

A second radio frequency amplifier for amplifying the other input signal stream and performing frequency mixing for the amplified signals and the other low frequency envelope injection signal stream;

A hybrid bridge for power synthesizing for the output signals from the first radio frequency amplifier and second radio frequency amplifier to obtain two compensation signals and amplified radio frequency signals of different directions;

Wherein, said first radio frequency amplifier is the same as said second radio frequency.

Preferentially, said hybrid bridge is a hybrid bridge of 90 degrees.

Employing the predistortion method and device described herein can achieve the compensation of the inter-modulated distortion component in arbitrary angle; because the inter-modulated distortion compensation signals are achieved by injecting low frequency envelope injection signals, the predistortion device is simplified significantly and the cost of the predistortion system is reduced.

PREFERRED EMBODIMENTS OF THE INVENTION

It is believed that the purpose, feature and advantages of the present invention described above may be understood better through the detailed description hereinafter for the embodiments of the present invention.

Figure 1:
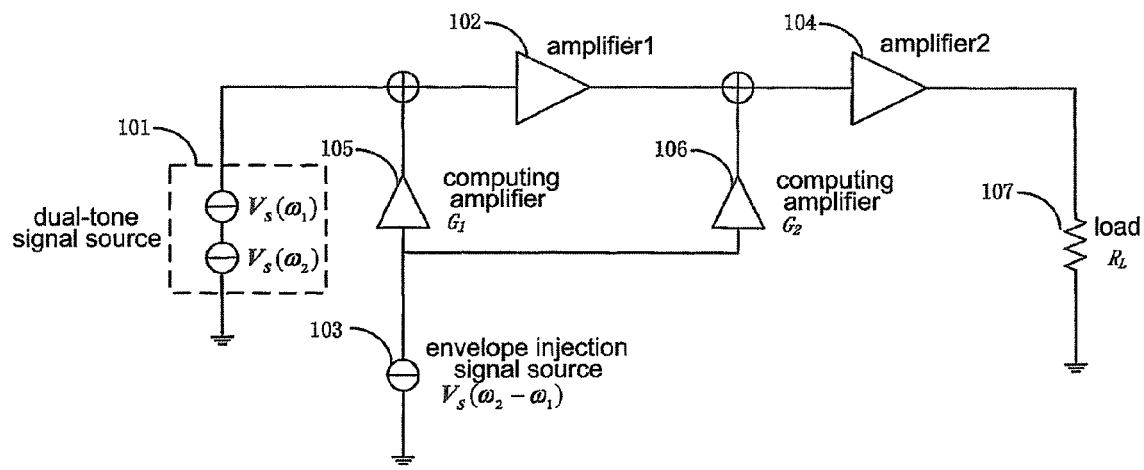
FIG. 1 is a schematic drawing of multi-point envelope injection technique in prior art.

FIG. 1 is a schematic drawing of multipoint envelope injection technique in prior art. As shown in FIG. 1, after amplified by radio frequency amplifiers 102 and 104, the output signals from dual-tone signal source 101 are added to load 107. Envelope injection signal source 103 is generated either independently or by frequency mixing of dual-tone signal source 101. The envelope signals generated by envelope injection signal source 103 are injected into radio frequency amplifiers 102 and 104 after being amplified respectively by computing amplifiers 105 and 106. Phases of distortion compensation signals may be controlled by controlling relative amplitudes and phases of the two envelope signals. However, the phase difference between distortion compensation components for radio frequency amplifiers 102 and 104 is usually small, therefore, it is possible for certain distortion components at specific angle to compensate ineffectively.

Figure 2:
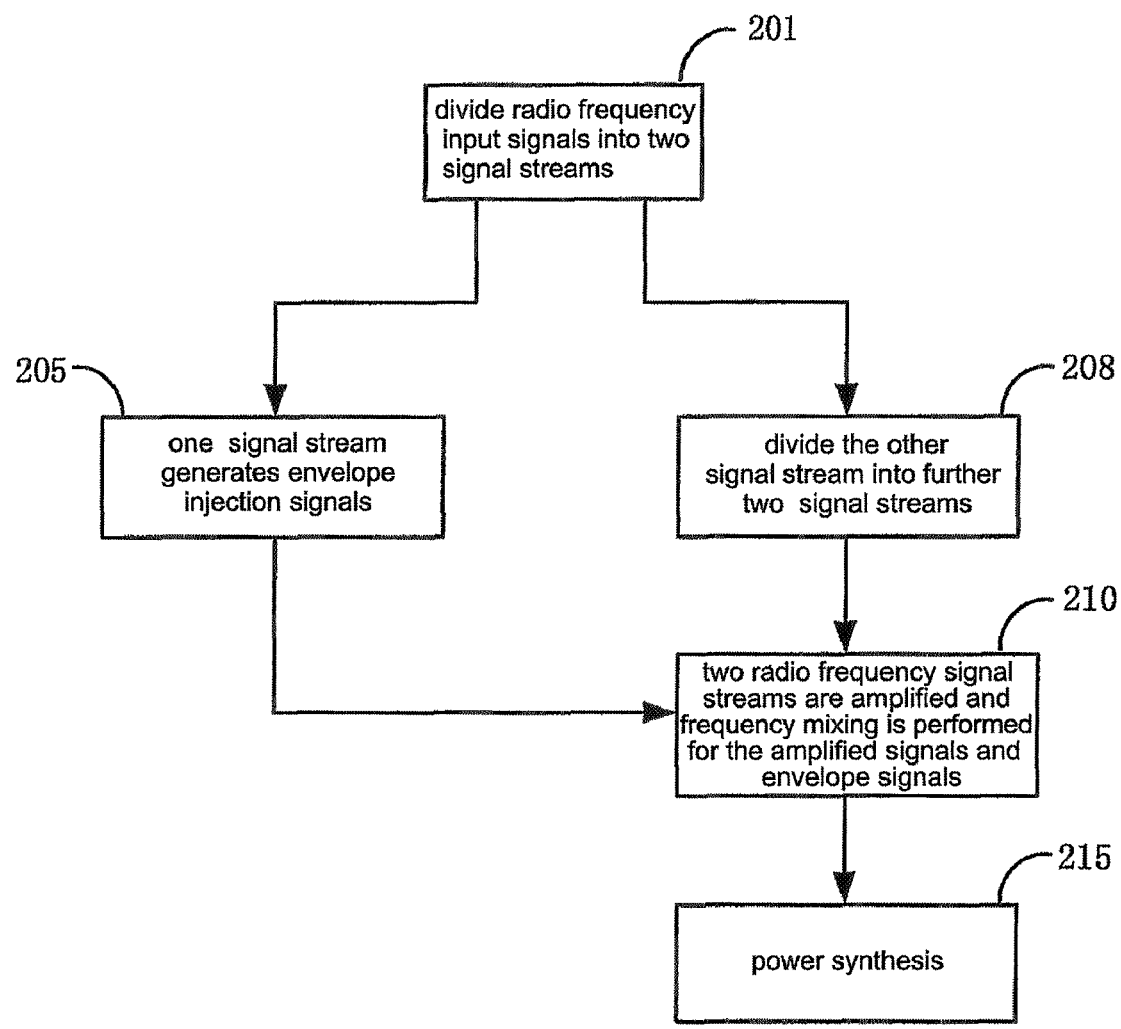
FIG. 2 is a flow chart of the predistortion method based on vector envelope injection in accordance with an embodiment of the present invention.

FIG. 2 is a flow chart of the predistortion method in accordance with one embodiment of the present invention. In step 201, radio frequency input signals are divided into two signal streams. One radio frequency input signal stream generates two envelope injection signals in which their amplitudes may be adjusted independently in step 205, and specific steps are as follows: extracting the envelope signal of the input signal as a quadratic item, since the required compensation signals, which are cubic item, are generated by performing frequency mixing for the envelope signal and the original radio frequency input signal (primary item), the envelope signals must be a quadratic item to generate the required cubic item; then filtering the envelope signals to obtain its low frequency envelope component; finally adjusting the amplitudes of the signals to generate two low frequency envelope injection signals in which their amplitudes can be adjusted independently so as to control respectively the amplitudes and phases of the compensation signals. In step 208, the other signal stream is divided into further two radio frequency signal streams. In step 210, the two radio frequency signal streams are amplified, meanwhile, frequency mixing is performed for said radio frequency signals and the two envelope injection signals generated in step 205 respectively to generate the required compensation signals. In step 215, the amplified radio frequency signals and the compensation signals are power synthesized to obtain two compensation signals and amplified radio frequency signals of different directions.

In principle, the compensation vector, which compensates the distortion component in arbitrary angle, may be achieved by superposing the compensation signals in arbitrary angle except 0 degree and 180 degrees, and because it is the easiest for orthogonal compensation signals to synthesize compensation vectors in any direction, preferentially, when the two compensation signals with different directions are generated in step 215, orthogonal power synthesis for the compensation signals is made to obtain two orthogonal compensation signals.

It can be known from the above description that the compensation for inter-modulated distortion component in arbitrary angle may be achieved by controlling the amplitudes and notations of the two low frequency envelope injection signals by adopting the present embodiment.

Figure 3:
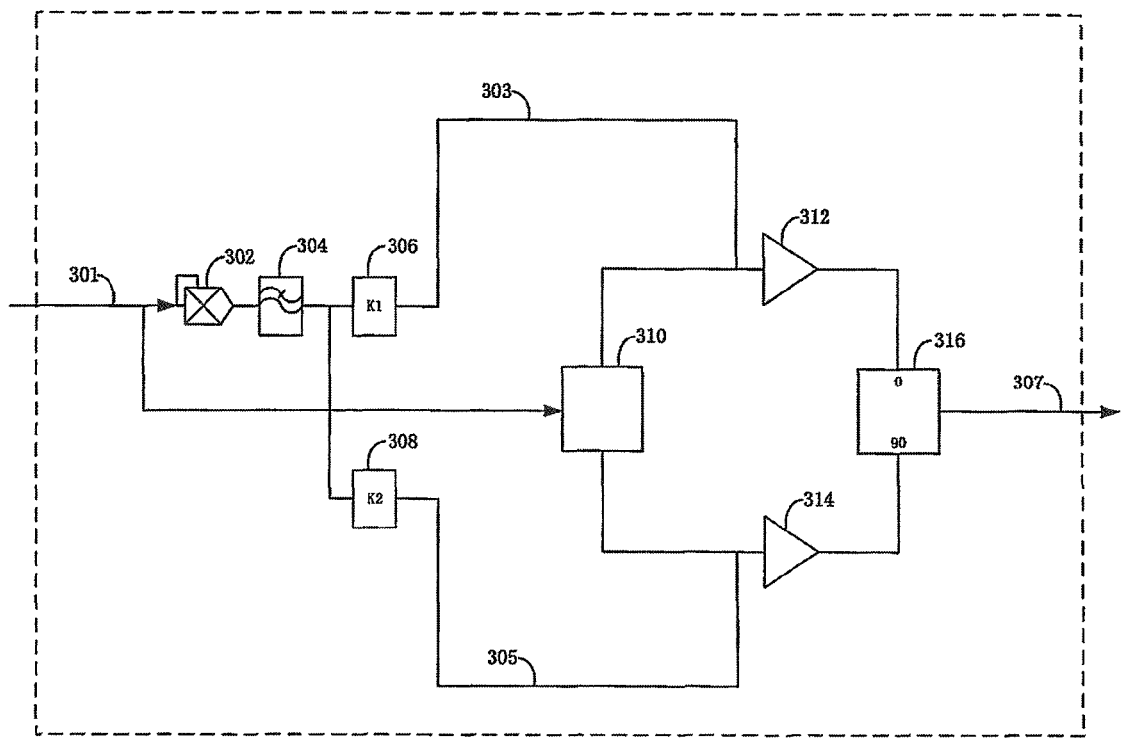
FIG. 3 is a block diagram of the predistortion device based on vector envelope injection in accordance with an embodiment of the present invention.

FIG. 3 is a block diagram of the predistortion device based on vector envelope injection in accordance with an embodiment of the present invention. As shown in FIG. 3, the device includes a multiplier 302, a low pass filter 304, a first proportional unit 306, a second proportional unit 308, a power divider 310, a first radio frequency amplifier 312, a second radio frequency amplifier 314 and a hybrid bridge 316. The hybrid bridge 316 is configured to power synthesize for signals so as to obtain two compensation signals of different directions. In principle, the compensation vector may be achieved by superposing the compensation signals in arbitrary angle except 0 degree and 180 degrees, and because it is the easiest for orthogonal compensation signals to synthesize compensation vectors in any direction, the hybrid bridge 316 is configured to be a hybrid bridge of 90 degrees in the present embodiment.

After entering the device, radio frequency input signals 310 are divided into two input signal streams. One input signal stream used to generate envelope signals is squared by the multiplier 302 and output to the low pass filter 304, by which the low frequency component of this signal is extracted. The low frequency component is input respectively into the first proportional unit 306 and the second proportional unit 308 to generate two low frequency envelope injection signals 305 and 306 whose amplitudes can be adjusted independently. The other input signal stream input into power divider 310 is divided into two input signal sub-streams by power divider 310, among which, the first input signal sub-stream 311 and the envelope injection signals 303 are amplified by the first radio frequency amplifier 312 and then transmitted to the hybrid bridge 316 of 90 degrees; the second input signal sub-stream 313 and the envelope injection signals 305 are amplified by the second radio frequency amplifier 312 and also transmitted to the hybrid bridge 316 of 90 degrees. The sizes and specifications of the first radio frequency amplifier 312 and the second radio frequency amplifier 314 are completely identical. Amplified signals is power synthesized in the hybrid bridge 316 of 90 degrees to obtain output signals 307, which is a synthesis of the original radio frequency input signals 301 and the predistortion signals carrying phase information. The hybrid bridge 316 of 90 degrees introduces a phase shift of 90 degrees for one of the two signal streams to ensure orthogonality of the compensation signals.

It can be known from the above description that radio frequency distortion compensation signals may be generated by low frequency envelope injection signals to achieve compensation for inter-modulated distortion by adopting the present embodiment.

Figure 4:
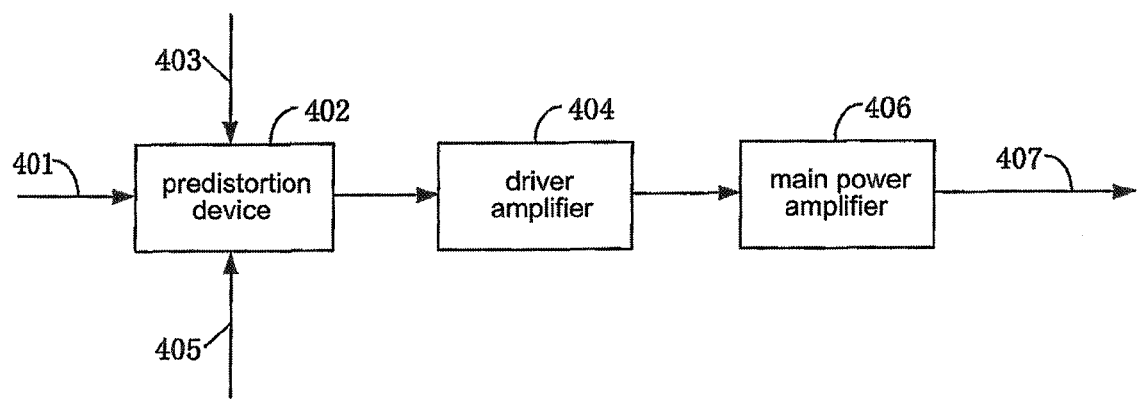
FIG. 4 is a schematic drawing of the position for the pre-distortion device shown in FIG. 3 in the whole radio frequency power amplification link circuit.

FIG. 4 is a schematic drawing of the position for the predistortion device shown in FIG. 3 in the whole radio frequency power amplification system. Received radio frequency input signals 401 are processed for predistortion by a predistortion device 402 shown in FIG. 3, in which the envelope injection signals 403 and 405 that control predistortion compensation parameters are generated according to the input signals based on the method described in FIG. 2. Then the output signals from predistortion device 402 are directly used to drive main power amplifier 406. If its power is insufficient, the main power amplifier 406 may be driven by the driver amplifier 404. If the size of the amplitude of the envelope injection signals is appropriate, the inter-modulated distortion of output signals 407 of the main power amplifier 406 may be controlled within a target requirement. Thus, in the whole radio frequency power amplification link circuit, the predistortion device 402 is located before the driver amplifier 404 and the main power amplifier 406.

Figure 5:
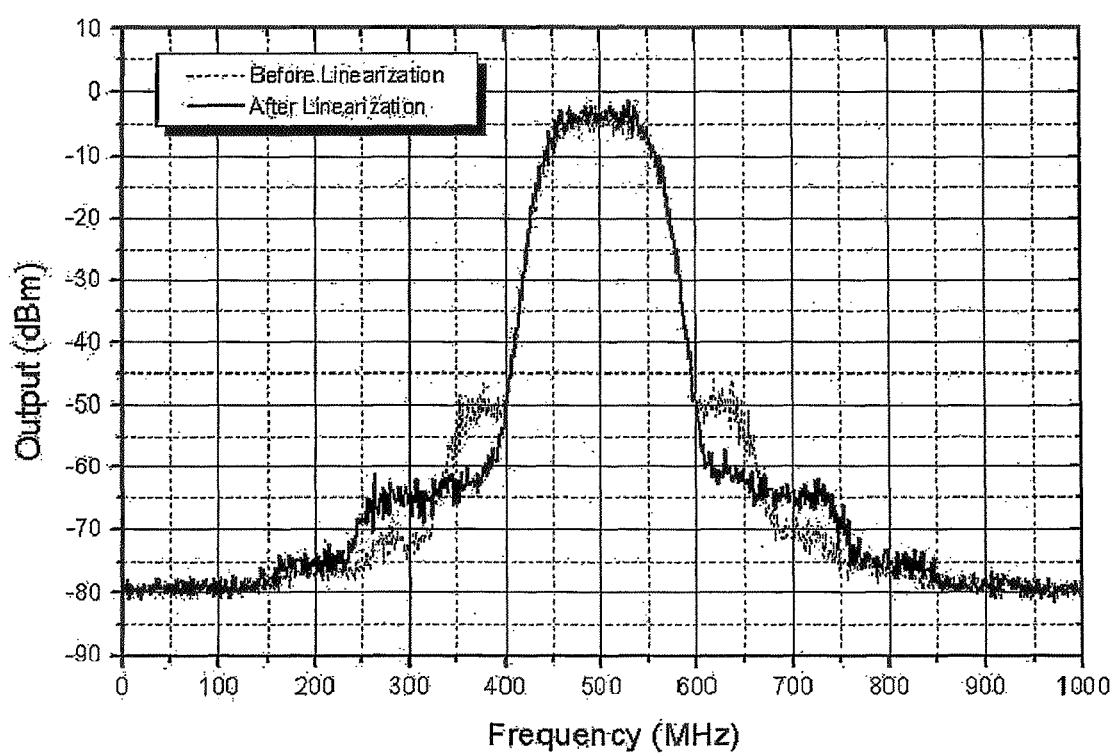
FIG. 5 is a schematic drawing of the result after the predistortion adopting the present invention.

FIG. 5 is a schematic drawing of the result after the predistortion adopting the present invention, wherein the dashed lines illustrate the frequency spectrum before the compensation, the solid lines illustrate the frequency spectrum after the compensation. PHS signals with bandwidth of 200 kHz are used in the experiment. It can be seen from the drawing that after employing the orthogonal envelope injection compensation, the result is apparent.

INDUSTRIAL APPLICABILITY

The method and device described in the present invention are simple to implement and the cost is low. It may be used in a base station subsystem, a mobile terminal, a wireless local area network (WLAN), which require linear amplification for bandwidth, of the third generation mobile communications, and are especially suitable for linearization of power amplifiers in the above systems.

What we claim is:

1. A predistortion method based on vector envelope injection, characterized in that said method comprises the following steps of:
    dividing radio frequency input signals into two signal streams;
    generating two envelope injection signals whose amplitudes can be adjusted independently by one input signal stream;
    dividing the other signal stream further into two radio frequency signal streams;
    amplifying said two radio frequency signal streams whose amplifying rates are the same;
    performing frequency mixing for said two envelope injection signals and said two radio frequency signal streams respectively to obtain two compensation signals;
    power synthesizing said amplified radio frequency signals and said compensation signals in the same way so as to obtain two compensation signals and amplified radio frequency signals of different phases.

2. The predistortion method based on vector envelope injection according to claim 1, characterized in that the step of generating the envelope injection signals further includes:
    extracting envelope signals of the input signals as a quadratic item;
    filtering the envelope signals to obtain their low frequency components;
    adjusting amplitudes of the low frequency envelope signals to obtain two low frequency envelope injection signals which control amplitudes and phases of the compensation signals respectively.

3. The predistortion method based on vector envelope injection according to claim 1, characterized in that the step of power synthesizing said compensation signals includes orthogonal power synthesizing the compensation signals to obtain two orthogonal compensation signals.

4. A predistortion device based on vector envelope injection, characterized in that said device comprises:
    a multiplier for squaring the radio frequency input signals;
    a low pass filter for extracting the low frequency components of signals;
    a first proportional unit and a second proportional unit for adjusting signal amplitude and generating two low frequency envelope injection signal streams;
    a power divider for dividing the radio frequency input signals into two input signal streams;

a first radio frequency amplifier for amplifying one input signal stream and performing frequency mixing for the amplified signal and the one low frequency envelope injection signal stream;

a second radio frequency amplifier for amplifying the other input signal stream and performing frequency mixing for the amplified signal and the other low frequency envelope injection signal stream;

a hybrid bridge for power synthesizing for output signals from the first radio frequency amplifier and the second radio frequency amplifier to obtain two compensation signals and amplified radio frequency signals of different directions;

wherein, the first radio frequency amplifier is the same as the second radio frequency amplifier.

5. The predistortion device based on vector envelope injection according to claim 4, characterized in that said hybrid bridge is a hybrid bridge of 90 degrees.

* * * * *